(12) United States Patent
Xue et al.

(10) Patent No.: US 10,200,018 B2
(45) Date of Patent: Feb. 5, 2019

(54) D FLIP-FLOP AND SIGNAL DRIVING METHOD

(71) Applicants: Semiconductor Manufacturing International (Shanghai) Corporation, Shanghai (CN); Semiconductor Manufacturing International (Beijing) Corporation, Beijing (CN)

(72) Inventors: Pan Dou Xue, Shanghai (CN); Guang Tao Feng, Shanghai (CN); Bu Xin Zhang, Shanghai (CN); Hui Hui Gu, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 29 days.

(21) Appl. No.: 15/397,822

(22) Filed: Jan. 4, 2017

(65) Prior Publication Data
US 2017/0201240 A1 Jul. 13, 2017

(30) Foreign Application Priority Data

Jan. 11, 2016 (CN) .......................... 2016 1 0015666

(51) Int. Cl.
H03K 3/3562 (2006.01)
H03K 3/013 (2006.01)
(Continued)

(52) U.S. Cl.
CPC ......... *H03K 3/35625* (2013.01); *H03K 3/012* (2013.01); *H03K 3/013* (2013.01); *H03K 3/356026* (2013.01); *H03K 19/096* (2013.01)

(58) Field of Classification Search
CPC .... H03K 3/35625; H03K 3/012; H03K 3/013; H03K 3/356026; H03K 19/096
(Continued)

(56) References Cited

U.S. PATENT DOCUMENTS 7,525,361 B2 * 4/2009 Kim ....................... H03K 3/012
327/208
7,816,964 B2 * 10/2010 Kim ............... G01R 31/318594
327/200

(Continued)

OTHER PUBLICATIONS

The European Patent Office (EPO) The Extended European Search Report for 16207478.5 dated Jun. 6, 2017, 14 Pages.
(Continued)

*Primary Examiner* — Dinh T Le
(74) *Attorney, Agent, or Firm* — Anova Law Group, PLLC

(57) ABSTRACT

The present disclosure provides D flip-flops and signal driving methods using D flip-flops thereof. An exemplary D flip-flop includes a pulse signal generating circuit configured to input a first clock signal, a first data signal, a second data signal and a third data signal and generate a clock pulse signal. The clock pulse signal responds a rising-edge and a falling-edge of the first clock signal. The pulse clock signal is a pulse signal when the first data signal is opposite to the second data signal. The D flip-flop also includes a latching circuit configured to sample and transfer the first data signal and a data signal opposite to the first data signal to be used as the second signal and a fourth data signal respectively when the clock signal is at the high level.

20 Claims, 6 Drawing Sheets

(51) Int. Cl.
*H03K 3/012* (2006.01)
*H03K 3/356* (2006.01)
*H03K 19/096* (2006.01)

(58) Field of Classification Search
USPC .................................................. 327/202–204
See application file for complete search history.

(56) References Cited

U.S. PATENT DOCUMENTS

| 2003/0052716 | A1 | 3/2003 | Kim et al. |
| 2006/0267627 | A1 | 11/2006 | Teh et al. |
| 2007/0024337 | A1* | 2/2007 | Teh ........................ H03K 3/012 327/172 |

OTHER PUBLICATIONS

Paanshul Dobriyal et al., A High Performance D-flip Flop Design with Low Power Clocking System Using MTCMOS Technique, 2013, 5 pages.

Peiyi Zhao et al., A Double-Edge Implicit-Pulsed Level Convert Flip-Flop, Proceedings of the IEEE Computer Society Annual Symposium on VLSI Emerging Trends in VLSI Systems Design, 2004, 4 pages.

Peiyi Zhao et al., Design of Sequential Elements for Low Power Clocking System, IEEE Transactions on VLSI System, 2011, vol. 19, 5 pages.

* cited by examiner

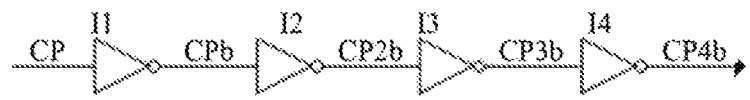
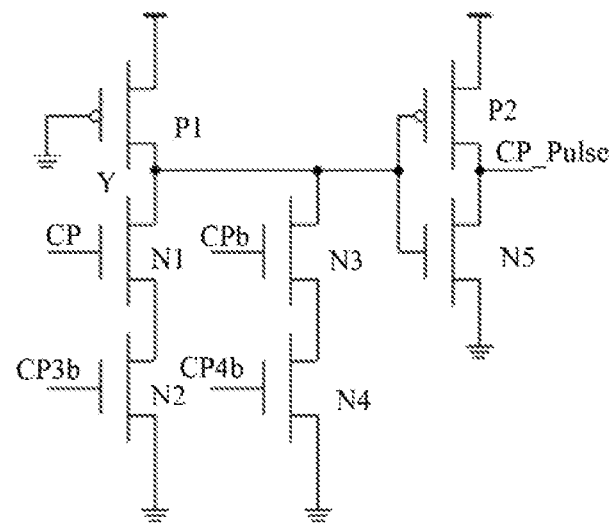
FIG. 2 (a) (Prior art)
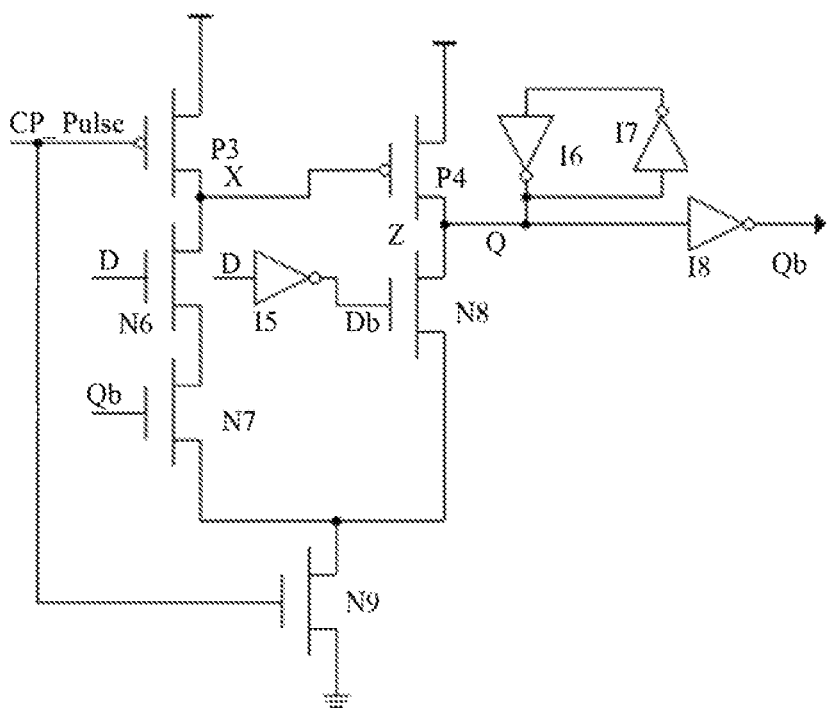
FIG. 2 (b) (Prior art)

D FLIP-FLOP AND SIGNAL DRIVING METHOD

CROSS-REFERENCES TO RELATED APPLICATIONS

This application claims the priority a Chinese patent application No. 201610015666.3, filed on Jan. 11, 2016, the entirety of which is incorporated herein by reference.

FIELD OF THE INVENTION

The present invention generally relates to the field of electronic technologies and, more particularly, relates to D flip-flops and signal driving methods thereof.

BACKGROUND

In digital systems, flip-flops are important components, having impact on all aspects of the performance of the digital systems, such as area, power consumption and speed, etc. In the design of the modern Very Large Scale Integration (VLSI), how to increase the speed of the chip, lower the power consumption, and save the area of the silicon wafer has become more and more important. As the important components of the digital system, how to improve the design of the flip-flops and how to design flip-flops with low power consumption and high speed are the major tasks to enhance the performance of the entire system. The conventional master-slave flip-flops have certain characteristics, such as relative complex circuit structures and the positive setup time, etc. Thus, it is difficult for the conventional master-slave flip-flops to achieve relative high speeds. D flip-flops are commonly used flip-flops. Among the D flip-flops, the double edge D flip-flops are widely used because of their relatively strong anti-interference ability.

The mainstream structure of the existing double-edge D flip-flops includes parallel-connected single-edge master-slave flip-flops. Such a flip-flop structure includes two parts: a clock raising-edge triggered D flip-flop and a clock falling-edge triggered flip-flop. The flip-flops having such a structure have a relative large power consumption; and the setup time is positive.

Another existing type of flip-flops are the pulse double-edge D flip-flops. A pulse double-edge D flip-flop includes a pulse signal generating circuit and a latching circuit; and responds to the raising-edge and the falling-edge of a clock signal. The pulse signal generating circuit generates narrow pulse signals; and the latching circuit samples the input signals of the D flip-flop. Two coupled inverters at the output terminals of the latching circuit latch the output signals of the D flip-flop. The setup time of the D flip-flops having such a structure is negative, more suitable to be applied in high-speed circuits. However, such D flip-flops are easy to generate redundant narrow signals; and the redundant narrow signals increase the power consumption of the circuit.

Thus, the power consumption of the existing D flip-flops is still relatively high. The disclosed circuit structures and methods are directed to solve the above mentioned issues and other problems in the art.

BRIEF SUMMARY OF THE DISCLOSURE

One aspect of the present disclosure includes a D flip-flop. An exemplary D flip-flop includes terminals configured to input a first clock signal and a first data signal and to output a second data signal and a third data signal opposite to the second signal; a pulse signal generating circuit configured to receive the first clock signal, the first data signal, the second data signal, and the third data signal and to generate a clock pulse signal, responding to a raising-edge and a falling-edge of the first clock signal, the pulse clock signal being a pulse signal when the first data signal is opposite to the second data signal, and being at a low level when the first data signal is similar as the second data signal; and a latching circuit configured to latch the second data signal and the third data signal when the clock pulse signal is at the low level, and to sample and transfer the first data signal and a data signal opposite to the first data signal to be used as the second signal and the third signal respectively when the clock pulse signal is at the high level.

Another aspect of the present disclosure includes a signal driving method using a D flip-flop. The method includes inputting as first clock signal, a first data signal, a second data signal, and a third data signal into a pulse generating circuit of the D flip-flop; generating a clock pulse signal; responding to a raising-edge and a falling-edge of the first clock signal; configuring the clock pulse signal is a pulse signal if the first data signal is opposite to the second data signal; keeping the clock pulse signal at a low level if the first data signal is the same as the second data signal; responding to the clock pulse signal using a latch circuit; latch the second data signal and the third data signal when the clock pulse signal is at a low level; and sampling and transferring the first data signal and a signal opposite to the first data signal to output terminals of the latching circuit to be used as the second data signal and the third data signal, respectively.

Other aspects of the present disclosure can be understood by those skilled in the art in light of the description, the claims, and the drawings of the present disclosure.

BRIEF DESCRIPTION OF THE DRAWINGS

FIG. 2(a) illustrates the circuit diagram of another existing D flip-flop;

FIG. 2(b) illustrates the circuit diagram of the latching circuit of an existing D flip-flop;

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
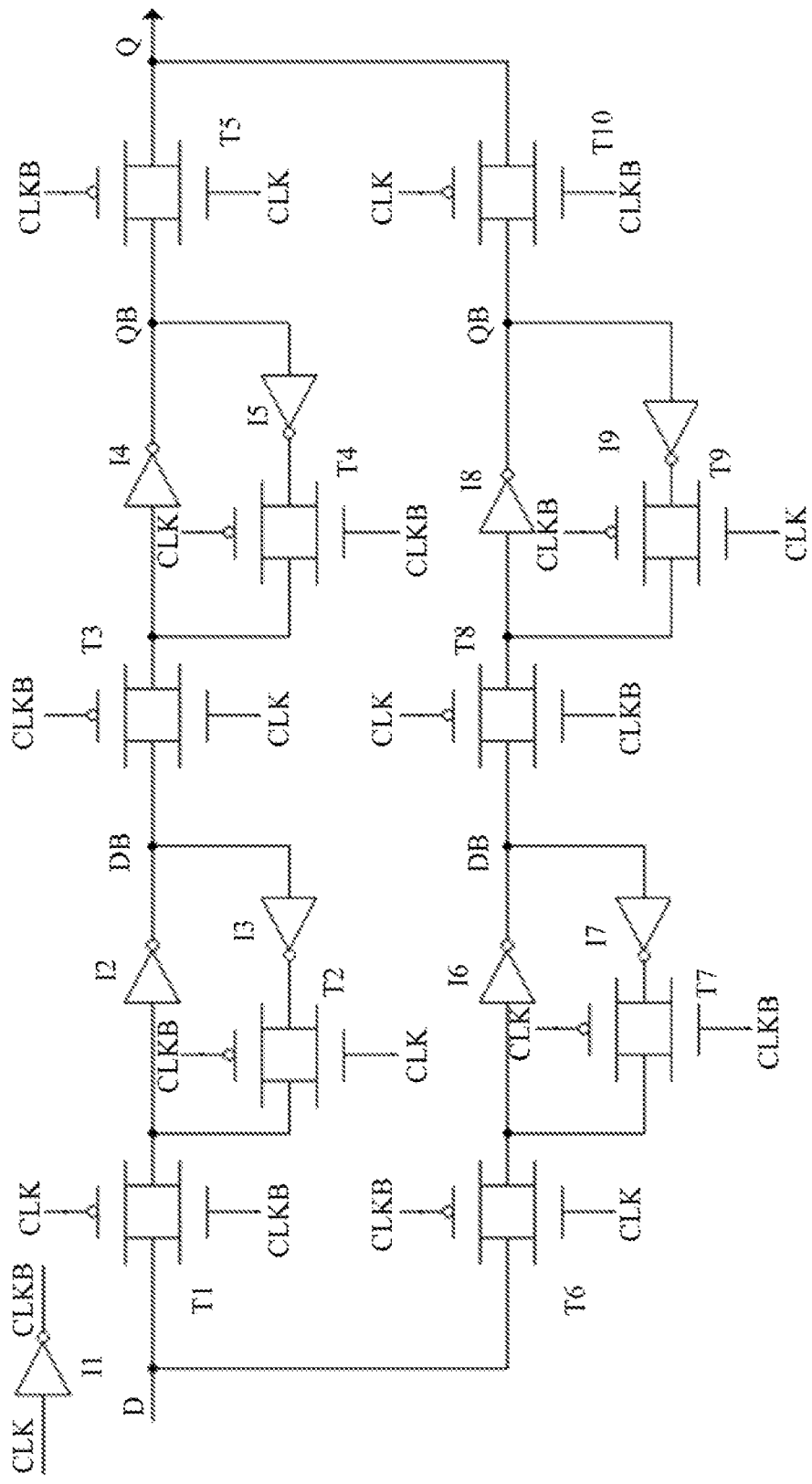
FIG. 1 illustrates the circuit diagram of an existing D flip-flop.

FIG. 1 illustrates the circuit diagram of an existing D flip-flop. As shown in FIG. 1, the existing D flip-flop is a double-edge D flip-flop formed by single edge D flip-flops connected in parallel. The D flip-flop includes transmission gates T1-T10 and inverters I1-I9. The D flip-flop includes two parts: a raising-edge triggered D flip-flop and a falling-edge triggered D flip-flop.

When the clock signal "CLK" is at a low level, the master latch of the raising-edge triggered flip flop responds to the input signal; and the slave latch is at a latching status. The master latch of the falling-edge triggered flip-flop is at a latching status. The slave latch receives the intermediate signal "DB" from the master latch. Thus, the transfer from "D" to "Q" is completed.

When the clock signal "CLK" is at a high level, the master latch of the raising-edge triggered flip-flop is at the latching status; and the slave latch receives the intermediate signal "DB"; and the transfer from "D" to "Q" finished. The master latch of the falling-edge triggered flip-flop responds the input signal. The slave latch is at the latching status.

The circuit structure of such a D flip-flop is relatively complex; and it consists of 10 transmission gates and 9 inverters. The total number of the transistors is up to 38. The corresponding circuit area is also relatively large; and the power consumption is correspondingly increased.

Further, as shown in FIG. 1, the setup time the D flip flop is an integer: $t_{setup}=t_{T1}+t_{T2}-t_{I1}$. The delay time from "CLK" to "Q" is $t_{ckq}=t_{T3}+t_{I4}+t_{T5}+t_{I1}$. Thus, such a structure needs a relatively long setup time, and a relatively large transfer delay.

FIGS. 2(a)-2(b) illustrate the circuit diagrams of the double-edge pulse signal generator and the latch of another existing D flip-flop. As shown in FIGS. 2(a)-2(b), the D flip-flop is a type of double-edge D flip-flop which utilizes the conditional discharging technology. In the double-edge signal generator, the gate of the PMOS transistor P1 is connected to a ground "GND"; and the node "Y" is charged. When the raising edge of the clock signal "CLK" is coming, due to the delay functions of the inverters I1, I2 and I3, the NMOS transistor N1 and the NMOS transistor N2 are turned on for a short period simultaneously. The node "Y" is discharged to a low level; and a narrow pulse signal "CP_pulse" is generated from the output terminal. When the falling-edge of the clock signal "CLK" is coming, due to the delay functions of the inverters I2, I3 and I4, the NMOS transistor N3 and the NMOS transistor N4 are turned on for a short period simultaneously. The node "Y" is also discharged to a low level; and a narrow pulse signal "CP_pulse" is generated from the output terminal. Thus, at the raising-edge and the falling edge of the clock signal CLK, the double-edge pulse signal generator all generate narrow pulse signals.

In the latch, when the narrow pulse is at a low level, the NMOS transistor N9 is turned off; and the PMOS transistor P3 is turned on. The internal node "X" is pre-charged to a high level through the PMOS transistor P3. The PMOS transistor P4 controlled by the node "X" is turned off. The output signal of the D flip-flop is kept stable through a pair of cross-coupled inverters. When the narrow pulse signal "CP_pulse" is turned from low level to the high level, the NMOS transistor N9 is turned on; and the PMOS transistor P3 is turned off. The D flip-flop has an evaluating response to the input signals. If the input signal "D" is a high level, and the output signal "Q" from the previous period is opposite to the input signal "D" from the current period. That is, the output signals of the D flip-flop from the previous period: Q=0 and Qb=1, the NMOS transistor N6 and the NMOS transistor N7 are turned on. The node "X" is discharged to a low level through the NMOS transistor N6, the NMOS transistor N7 and the NMOS transistor N9. The PMOS transistor P4 controlled by the node "X" is turned on; and the node "Z" is charged to a high level. The output signals: Q=1 and Qb=0. When the input signal "D" is at a low level "Db" is at a high level; and the NMOS transistor N8 is turned on. Thus, the node "Z" is discharged to the low level; and the output signals: Q=0 and Qb=1. The entire D flip-flip finishes the response to the input signal: Q=D.

The D flip-flop having such a structure utilizes a conditional discharging technique, the redundant transfer is achieved through the NMOS transistor N7; and the power consumption of the circuit is reduced. On the other hand, the input signal of the D flip-flop may reach a stable status after the effective edge of the clock signal comes when the delay of the inverter chain of the flip-flop is long enough. Thus, the setup time of the D flip-flop is negative. The circuit of such a flip flop lowers the requirements of the timing sequence of the input signal; and may be used in a high-speed circuit. However, it is easy for such a flip-flop to generate redundant narrow pulse signals; and the unnecessary power consumption of the circuit is increased.

Figure 3:
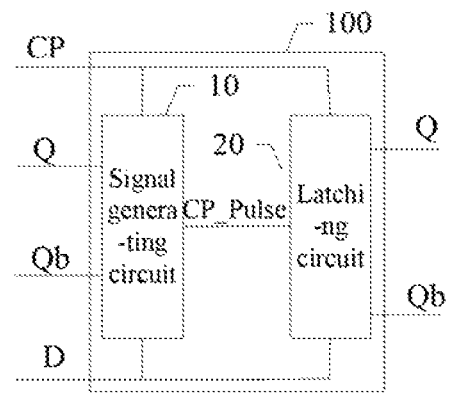
FIG. 3 illustrates an exemplary D flip-flop consistent with the disclosed embodiments.

Thus, the D flip-flop formed by the existing techniques may still have the relatively large power consumption issue. The present disclosure presents an improved double-edge D flip flop having a relatively low power consumption. FIG. 3 illustrates an exemplary D flip-flop consistent with the disclosed embodiments.

As shown in FIG. 3, the D flip-flop 100 may be configured to input a first clock signal "CP" and a first data signal "D"; and output a second data signal "Q" and a third data signal "Qb" (Q bar). The third data signal "Qb" may be inverse or opposite to the second data signal "Q". The second date "Q" and the third data signal "Qb" may also be inputted back to the D flip-flop 100. The D flip-flop may be a double-edge D flip-flop.

The D flip-flop 100 may include a pulse signal generating circuit 10. The pulse signal generating circuit 10 may be configured to receive or input the first clock signal "CP", the first data signal "D", the second data signal "Q", and the third data signal "Qb", and to generate a clock pulse signal "CP_Pulse". The clock pulse signal "CP_Pulse" may respond to the raising-edge and the falling-edge of the first clock signal "CP". If the first data signal "D" opposite to the second data signal "Q", the clock pulse signal "CP_Pulse" generated by the pulse signal generating circuit 10 may be configured as a pulse signal. If the first data signal "D" and the second data signal "Q" are same, the clock pulse signal "CP_pulse" may be kept at a low level.

The D flip-flop 100 may also include a latching circuit 20. The latching circuit 20 may respond to the clock pulse signal "CP_Pulse". When the clock pulse signal "CP_Pulse" is at a low level, the second data signal "Q" and the third data signal "Qb" may be latched. When the clock pulse signal "CP_Pulse" is at a high level, the latching circuit 20 may sample and transfer the first data signal "D" and a signal opposite to the first data signal "D". The transferred first data signal "D" and the transferred signal opposite to the first data signal "D" may be used as the second data signal "Q" and the third data signal "Qb". Thus is, the signal driving process is finished.

Referring to FIG. 3, the input signals and the output signals of the D flip-flop 100 may be introduced into the input terminals of the pulse signal generating circuit 10. Further, the input terminals of the pulse signal generating circuit 10 may also respond the raising-edge and the falling-edge of the first clock signal "CP". Only when the first data signal "D" is opposite to the second data signal "Q" of the first clock signal "CP" in the previous period, the clock pulse signal "CP_Pulse" may be generated. When the first data signal "D" is the same as the second data signal "Q" of the first clock signal "CP" in the previous period, because the output signals of the D flip-flop may not be inverted, the generated clock pulse signal may be the redundant signal. By inhibiting the generation of the redundant narrow pulse signal, the power consumption of the D flip-flop 100 may be reduced.

Figure 4:
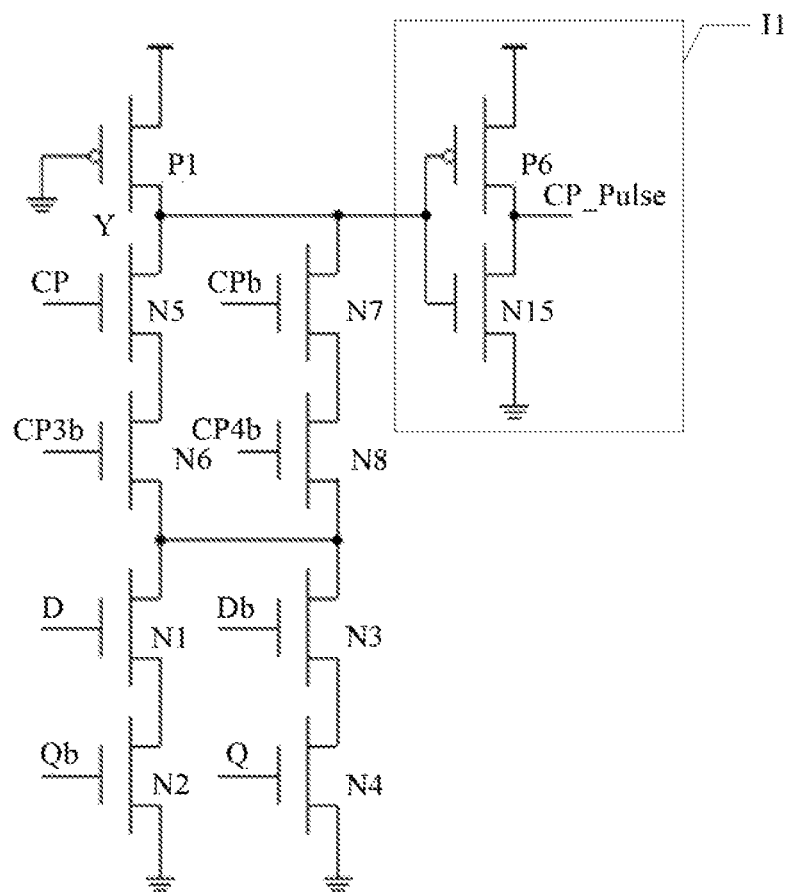
FIG. 4 illustrates an exemplary circuit diagram or a pulse signal generating consistent with the disclosed embodiments.

FIG. 4 illustrates an exemplary circuit diagram of the pulse signal generating circuit 10 consistent with the disclosed embodiments. As shown in FIG. 4, the pulse signal generating circuit 10 may include a charging/discharge node "Y". The charging/discharging node "Y" may be connected to a power source.

The pulse signal generating circuit 10 may also include a first clock signal switching circuit (not labeled). The input terminal of the first clock signal switching circuit may be connected to the charging/discharging node "Y"; and may respond the raising-edge of the first clock signal "CP". The connecting path between the input terminal and the output terminal of the first clock signal switching circuit may be turned on during a first pre-set time window.

Further, the pulse signal generating circuit 10 may also include a second clock signal switching circuit (not labeled). The input terminal of the second clock signal switching circuit may be connected to the charging/discharging node "Y". The output terminal of the second clock signal switching circuit may be connected to the output terminal of the first clock signal switching circuit; and may respond to the falling-edge of the first clock signal "CP". The connecting path between the input terminal and the output terminal of the second clock signal switching circuit may be turned on during a second pre-set time window.

Further, the pulse signal generating circuit 10 may also include a pulse inverting control circuit (not labeled). The input terminal of the pulse inverting control circuit may be connected to the output terminal of the first clock signal switching circuit and the output terminal of the second clock signal switching circuit. The output terminal of the pulse inverting control circuit may be connected to ground. When the first data signal "D" and the second data signal "Q" of a previous period are opposite, the connection path between the output terminal and the input terminal of the pulse inverting control circuit may be turned on.

Further, the pulse signal generating circuit 10 may also include a first inverter I1. The output terminal of the first inverter I1 may be connected to the charging/discharging node "Y". The output terminal of the first inverter I1 may output the clock pulse signal "CP_Pulse".

Referring to FIG. 4, the pulse inverting control circuit may include a first data switching circuit (not labeled) and a second data switching circuit (not labeled). The first terminal of the first data switching circuit may be connected to the first terminal of the second data switching circuit; and may be configured as an input terminal of the pulse inverting control circuit. The second terminal of the first data switching circuit may be connected to the second terminal of the second data switching circuit; and may be connected to the ground. The first data switching circuit may be configured to input the first data signal "D" and the third data signal "Qb". The second data switching circuit may be configured to input the second data signal "Q" and the fourth data signal "Db". The fourth data signal "Db" may be opposite to the first data signal "D".

Referring to FIG. 4, the first data switching circuit may include a first NMOS transistor N1 and a second NMOS transistor N2. The gate of the first NMOS transistor N1 may be configured to input the first data signal "D". The source of the first NMOS transistor N1 may be connected to the drain of the second NMOS transistor N2. The drain of the first NMOS transistor N1 may be connected to the input terminal of the pulse inverting control circuit. The gate of the second NMOS transistor N2 may be configured to input the third data signal "Qb"; and the source of the second NMOS transistor N2 may be connected to the ground.

The second data switching circuit may include a third NMOS transistor N3 and a fourth NMOS transistor N4. The gate of the third NMOS transistor N3 may be configured to input the fourth data signal "Db". The source of the third NMOS transistor N3 may be connected to the drain of the fourth NMOS transistor N4. The drain of the third NMOS transistor N3 may be connected to the input terminal of the pulse inverting control circuit. The gate of the fourth NMOS transistor N4 may be configured to input the second data signal "Q". The source of the fourth NMOS transistor N4 may be connected to a ground.

In one embodiment, the first data switching circuit and the second data switching circuit may be formed in the pulse inverting control circuit. In one specific embodiment, the first data switching circuit and the second data switching circuit may include two NMOS transistors, respectively. Because the pulse inverting control circuit may need to respond the first data signal to the fourth data signal. The number of the NMOS transistors in the pulse inverting control circuit may be four.

The pulse inverting control circuit may have following functions. When the first data signal and the third data signal are both at a high level, the first data switching circuit may be turned on. When the second data signal and the fourth data signal are both at a high level, the second data switching circuit may be turned on. Thus, in one embodiment, four NMOS transistors are included in the pulse inverting control circuit for illustrative purposes. In certain other embodiments, more than four high level controllable modules may be used to achieve the pulse inverting function.

Referring to FIG. 4, the charging/discharging node "Y" may be connected to the power source through the first PMOS transistor P1. The source of the first PMOS transistor P1 may be connected to the power source. The gate of first PMOS transistor P1 may be connected to the ground. The drain of the first PMOS transistor P1 may be connected to the charging/discharging node "Y".

Such a circuit connection scheme may cause the first PMOS transistor P1 to be always turned on. Thus, the charging/discharging node "Y" may be at a high level (approximately equal to the power source) when the charging/discharging node "Y" is charged. In certain other embodiments, the charging/discharging node "Y" may be connected to the power source through other device structure, such as a resistor, etc.

Further, referring to FIG. 4, in one embodiment, the first clock switching circuit may include a fifth NMOS transistor N5 and a sixth NMOS transistor N6. The drain of the fifth NMOS transistor N5 may be connected to the charging/discharging node "Y". The gate of the fifth NMOS transistor N may be input the first clock signal "CP". The source of the fifth NMOS transistor N5 may be connected to the drain of the sixth NMOS transistor N6. The source the sixth NMOS transistor N6 may be connected to the input terminal of the pulse inversion control circuit. The gate of the sixth NMOS transistor N6 may be configured to input a fourth clock signal "CP3b". The fourth clock signal "CP3b" may be opposite to the first clock signal "CP". Further, the fourth clock signal "CP3b" may have a third delay with the first clock signal "CP".

In one embodiment, the second clock switching circuit may include a seventh NMOS transistor N7 and an eighth NMOS transistor N8. The drain of the seventh NMOS transistor N7 may be connected to the charging/discharging node "Y". The gate of the seventh NMOS transistor N7 may be configured to input the second clock signal "CPb". The source of the seventh NMOS transistor N7 may be connected to the drain of the eighth NMOS transistor N8. The phase of the second clock signal "CPb" may be opposite to the phase of the first clock signal "CP". Further, the second clock signal "CPb" may have a first delay with the first clock signal "CP". The first delay may be smaller than the third delay.

The source of the eighth NMOS transistor N8 may be connected to the input terminal of the pulse inverting control circuit. The gate of the eighth NMOS transistor N8 may be configured to input the fifth clock signal "CP4b". The fifth clock signal "CP4b" may have a same phase with the first clock signal "CP". Further, the fifth clock signal "CP4b" may have a fourth delay with the first clock signal "CP". The fourth delay may be greater than the third delay.

In one embodiment, the first clock switching circuit and the second clock switching circuit may include two NMOS transistors. Because the first clock switching circuit and the second clock switching circuit may need to respond the first clock signal, the second clock signal, the fourth clock signal and the fifth clock signal, the first clock switching circuit and the second clock signal switching circuit may have following functions. When the first clock signal and the fourth clock signal are both at a high level, the first clock switching circuit may be turned on. When the second clock signal and the fourth clock signal are both at a high level, the second clock switching circuit may be turned on.

For illustrative purposes, the first clock switching circuit and the second clock switching circuit may include two NMOS transistors, respectively. In certain other embodiments, more than two high level controllable devices may be used in the first clock switching circuit and the second clock switching circuit, respectively.

The first invert I1 may be a generic inverter structure. As shown in FIG. 4, the first inverter I1 may include a PMOS transistor (a sixth PMOS transistor P6) and an NMOS transistor (a fifteenth NMOS transistor N15).

The source of the sixth PMOS transistor P6 may be connected to the power source. The gate of the sixth PMOS transistor P6 may be connected to the gate of the fifteenth NMOS transistor N15 in parallel; and connected to the output terminal of a first connecting circuit (not labeled). The drain of the sixth PMOS transistor P6 may be connected to the drain of the fifteenth NMOS transistor N15; and may output the clock pulse signal "CP_Pulse".

Figure 5:
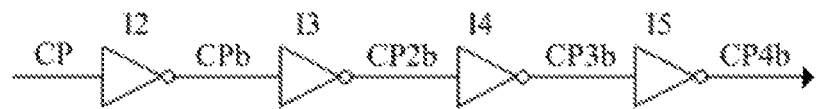
FIG. 5 illustrates the circuit diagram of an exemplary circuit for generating a second clock signal, a fourth clock signal and a fifth clock signal consistent with the disclosed embodiments.

FIG. 5 illustrates the circuit diagram of an exemplary circuit for generating the second clock signal "CPb", the fourth clock signal "CP3b" and the fifth clock signal "CP4b". As shown in FIG. 5, the first clock signal "CP" may be able to go through a second inverter I2 to output the second clock signal "CPb". The second clock signal "CPb" may go through a third inverter I3 to output the third clock signal "CP2b". The third clock signal "CP2b" may go through a fourth inverter I4 to output the fourth clock signal "CP3b." The fourth clock signal "CP3b" may go through the fifth inverter I5 to output the fifth clock signal "CP4b".

Referring to FIG. 5, in one embodiment, the first delay between the second clock signal "CPb" and the first clock signal "CP" may be the device delay of the first inverter I2. The third delay between fourth clock signal "CP3b" and the first clock signal "CP" may be the total device delay of the second inverter I2, the third inverter I3 and the fourth inverter I4. The fourth delay between fifth clock signal "CP4b" and the first clock signal "CP" may be the total device delay of the second inverter I2, the third inverter I3 the fourth inverter I4 and the fifth inverter I5.

Theoretically, the device delay of each inverter may be same. Thus, the third delay may be approximately three times of the first delay; and the fourth delay may be approximately four times of the first delay. Correspondingly, the first pre-set time window may be the same as the second pre-set time window. Further, the first pre-set time window or the second pre-set time window may correspond to the pulse width of the clock pulse signal "CP_Pulse". In the reality, the device delay of each inverter may be different. Thus, the correlation among the first delay, the third delay and the fourth delay and the correlation between the first pre-set time window and the second pre-set time window may not be limited.

Further, in one embodiment, for illustrative purposes, the second clock signal, the third clock signal and the fifth clock signal may be generated by the inverters. In certain other embodiments, one or more devices having the phase inverting function may be used to generate the second clock signal, the third clock signal and the fifth clock signal.

Figure 6:
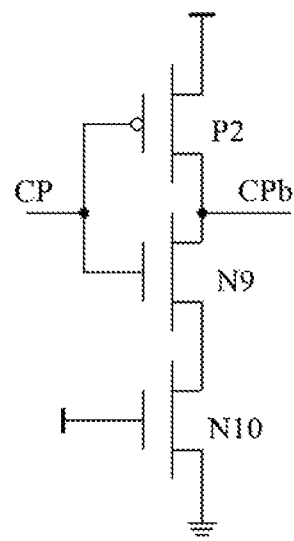
FIG. 6 illustrates an exemplary circuit diagram of an inverter consistent with the disclosed embodiments.

FIG. 6 illustrates the circuit diagram of the second inverter I2 illustrated in FIG. 5. As shown in FIG. 6, in one embodiment, the second invert I2 may include a second PMOS transistor P2, a ninth NMOS transistor N9 and a tenth NMOS transistor N10.

The gate of the second PMOS transistor P2 may be connected to the gate of the ninth NMOS transistor N9; and may be used as the input terminal of the second inverter I2. The source of the second NMOS transistor P2 may be connected to the power source. The drain of the second PMOS transistor P2 may be connected to the drain of the ninth PMOS transistor and may be used as the output terminal of the second inverter I2.

The source of the ninth NMOS transistor N9 may be connected to the drain of the tenth NMOS transistor N10. The gate of the tenth NMOS transistor N10 may be connected to the power source. The source of the tenth NMOS transistor N10 may be connected to the ground. In certain other embodiments, the second inverter I2 may also use a similar structure as the first inverter I1 illustrated in FIG. 4.

In one embodiment, referring to FIG. 6, the gate of the tenth NMOS transistor N10 may be connected to a high level. Thus, the tenth NMOS transistor N10 may be equivalent to a resistor. The resistance of such a resistor may be adjusted by adjusting the channel length of the tenth NMOS transistor N10 during the semiconductor fabrication process. Accordingly, the total delay of the inverter chain may be adjusted according to different requirements; and the different setup time requirements of the D flip-flop 10 may be satisfied.

As shown in FIGS. 4-6, the working mechanism of the pulse signal generating circuit 10 may be as followings. The gate of the first PMOS transistor P1 may be connected to the ground; and the charging/discharge node "Y" may be charged. When the raising-edge of the first clock signal "CP" arrives, because of the delays of the second inverter I2, the third inverter I3 and the fourth inverter I4, the fifth NMOS transistor N5 and the sixth NMOS transistor N6 may be turned on simultaneously for a short period. If the current first data signal "D" is opposite to the second data signal "Q" of the previous period, at least one of the first data switching circuit (the first NMOS transistor N1 and the second NMOS transistor N2) and the second data switching circuit (the third NMOS transistor N3 and the fourth NMOS transistor N4) may be turned on. Thus, the charging/discharging node "Y" may be discharged to a low level; and a narrow pulse signal may be generated from the output terminal of the first inverter I1. The narrow pulse signal may be the clock pulse signal "CP_Pulse". However, when the first data signal "D" is the same as the second data signal of the previous period, no matter how the first clock signal "CP" changes, the clocks of the first NMOS transistor N1, the second NMOS transistor N2, the third NMOS transistor N3 and the fourth NMOS transistor N4 may be turned off; and the charging/discharging node "Y" may always be at the high level. The clock pulse signal "CP_Pulse" may always be at a low level.

Figure 7:
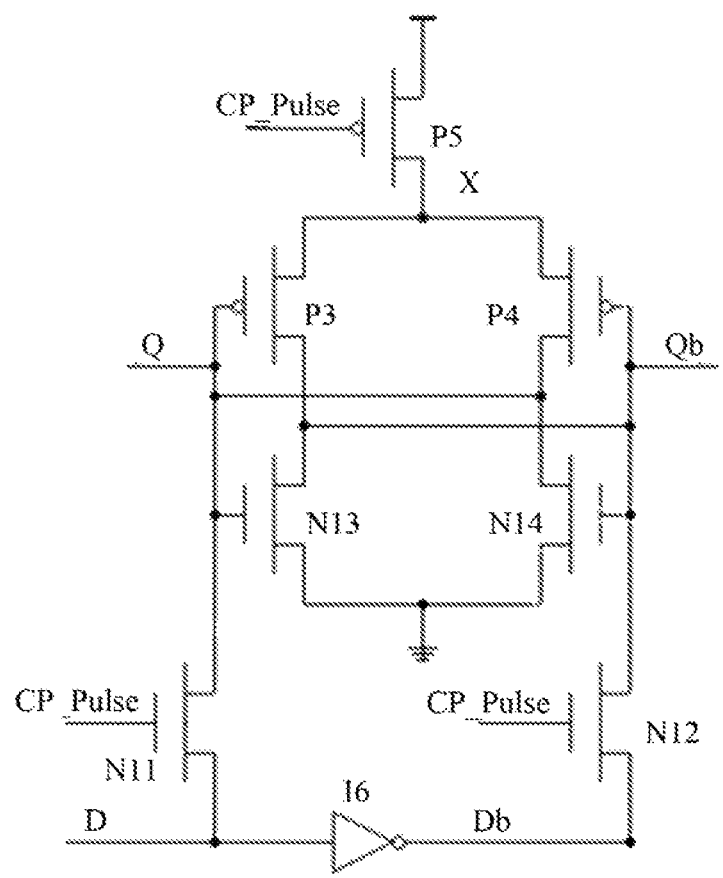
FIG. 7 illustrates the circuit diagram of an exemplary latching circuit consistent with the disclosed embodiments.

FIG. 7 illustrates the circuit diagram of an exemplary latching circuit consistent with the disclosed embodiments. As shown in FIG. 7, the latching circuit 20 may include a sixth inverter I6. The sixth inverter I6 may be configured to invert the phase of the first data signal "D" to output the fourth data signal "Db".

Further, the latching circuit 20 may also include a transmission circuit and a latch interconnected with each other. When the clock pulse signal "CP_Pulse" is at a high level, the transmission circuit may sample the first data signal "D" and transfer the sampled data to the first output terminal of the latch to be used as the second data signal "Q". Further, the transmission circuit may sample the fourth data signal "Db" and transfer the sampled data to the second terminal of the latch to be used as the third data signal "Qb". When the clock pulse signal "CP_Pulse" is at a low level, the latch may latch the second data signal "Q" and the third data signal "Qb".

In one embodiment, the structure of the sixth inverter I6 may be similar to the first inverter I1 illustrated in FIG. 4. In certain other embodiments, the sixth inverter I6 may have other appropriate structure.

Further, referring to FIG. 7, the power source terminal of the latch may be connected to the power source through a pulse connecting circuit trait (not shown). When the clock pulse signal "CP_Pulse" is at a low level, the pulse connecting circuit may be turned on. When the clock pulse signal "CP_Pulse" is at a high level, the pulse connecting circuit may be tuned off.

In one embodiment, the transmission circuit may include an eleventh NMOS transistor N11 and a twelfth NMOS transistor N12. The gate of the eleventh transistor N11 may be configured to input the clock pulse signal "CP_Pulse". The drain of the eleventh NMOS transistor N11 may be connected to the input terminal of the sixth inverter I6. The source of the eleventh transistor N11 may be configured to output the second data signal "Q".

The gate of the twelfth NMOS transistor N12 may be configured to input the clock pulse signal "CP_Pulse". The drain of the twelfth NMOS transistor N12 may be connected to the input terminal of the sixth inverter I6. The source of the twelfth NMOS transistor N12 may be configured to output the third data signal "Q".

In certain other embodiments, other devices, such as MOS transistors, or transmission gates, etc., may be used in the transmission circuits. When only the MOS transistors are used to form the transmission circuit, the transfer time of the transmission circuit may be relatively short; and the speed of the transmission circuit may be increased.

Further, referring to FIG. 7, the latch may include a third PMOS transistor P3, a fourth PMOS transistor P4 and a thirteenth NMOS transistor N13 and a fourteenth NMOS transistor N14. The gate of the third PMOS transistor P3 may be connected to the gate of the thirteenth NMOS transistor N13; and configured to receive the second data signal "Q". The source of the third PMOS transistor P3 may be connected to the source of the fourth PMOS transistor P4; and may be used as the power source terminal of the latch. The drain of the third PMOS transistor P3 may be connected to the drain of the thirteenth NMOS transistor N13 and the gate of the fourth PMOS transistor P4.

The gate of the fourth PMOS transistor P4 may be connected to the gate of the fourteenth NMOS transistor N14; and may be configured to receive the third data signal "Qb". The drain of the fourth PMOS transistor P4 may be connected to the drain of the fourteenth NMOS transistor N14 and the gate of the third PMOS transistor P3.

The source of the thirteenth NMOS transistor N13 may be connected to a ground. The source of the fourteenth NMOS transistor N14 may be connected to a ground.

In certain other embodiments, the latching circuit may also be the double-inverter circuit illustrated in the FIG. 2(b). Such a latching circuit may also achieve the latching functions to the data signals.

Further, as shown in FIG. 5, the pulse switching circuit may include a fifth PMOS transistor P5. The gate of the fifth PMOS transistor P5 may be configured to input the clock pulse signal "CP_Pulse". The source of the fifth PMOS transistor P5 may be connected to the power source. The drain of the fifth PMOS transistor P5 may be connected to the power source terminal of the latch.

In one embodiment, the pulse switching circuit may respond the clock pulse signal "CP_Pulse". When the clock pulse signal "CP_Pulse" is at a low level, the pulse switching circuit may be turned on. When the clock pulse signal "CP_Pulse" is at a high level, the pulse switching circuit may be tuned off.

In certain other embodiments, other appropriate devices, or device combinations may be used in the pulse switching circuit. Such devices or device combinations may be turned on when the clock pulse signal "CP_Pulse" is at a low level.

Referring to FIG. 7, the working mechanism, of the latching circuit 20 may be as followings. The clock pulse signal "CP_Pulse" is input in the gates of the eleventh NMOS transistor N11, the twelfth NMOS transistor N12 and the fifth PMOS transistor P5. When the clock pulse signal "CP_Pulse" is at a low level, the eleventh NMOS transistor N11 and the twelfth NMOS transistor N12 may be turned off; and the fifth PMOS transistor P5 may be turned on. The latch having two coupled inverters may be at the latching status. When the clock pulse signal "CP_Pulse" is at a high level, the eleventh NMOS transistor N11 and the twelfth NMOS transistor N12 may be turned on; and the fifth PMOS transistor P5 may be turned off. The first data signal "D" and the fourth data signal "Db" may be inverted by the sixth inverter I6 to be opposite to the first data signal "D"; and may be transferred to the output terminals of the latching circuit 20 through the eleventh NMOS transistor N11 and the twelfth NMOS transistor N12, respectively. Thus, the second data signal "Q" and the third data signal "Qb" may be outputted.

In one embodiment, the eleventh NMOS transistor N11 and the twelfth NMOS transistor N12 may have a threshold loss when the eleventh NMOS transistor N11 and the twelfth NMOS transistor N12 transfer "high level" data. However, when the latch is at the latching status, the high level of the output signals may be pulled to the source voltage; and the threshold loss may be eliminated.

The setup time of the D flip-flop 100 may be presented as $t_{setup}=t_{I6}+t_{N12}-t_{on}$. "$t_{I6}$" refers to the delay of the sixth inverter I6. "$t_{N12}$" refers to the transfer delay of the twelfth NMOS transistor N12 that is used as the transfer transistor. "$t_{on}$" refers to the delay of the first clock signal "CP" through the pulse signal generating circuit 10 (mainly includes the four inverters). When the clock pulse signal "CP_Pulse" changes from a high level to a low level, the clock pulse signal "CP_Pulse" may become a turn-off signal for the eleventh NMOS transistor N11 and the twelfth NMOS transistor N12. If the input signal on the gate of the NMOS transistor N12 is able to successfully setup before the turn-off signal comes, the setup time "$t_{setup}$" may be negative. That is, the disclosed D flip-flop may have a negative setup time.

In the practical application, "$t_{on}$" may be greater than "$t_{I6}$" and "$t_{N12}$". Further, the setup time "$t_{setup}$" tray be adjusted by the second inverter I2.

Further, according to the circuit structure of the latching circuit 20, the transfer time of the latching circuit 20 may be determined by individual transmission gates. Thus, comparing with inverters, the transfer time of the latching circuit 20 may be reduced; and the working speed of the circuit may be increased. Further, the disclosed D flip-flop may have a less number of transistors. Thus, the tower consumption of the disclosed D flip-flop may be further reduced.

Figure 8:
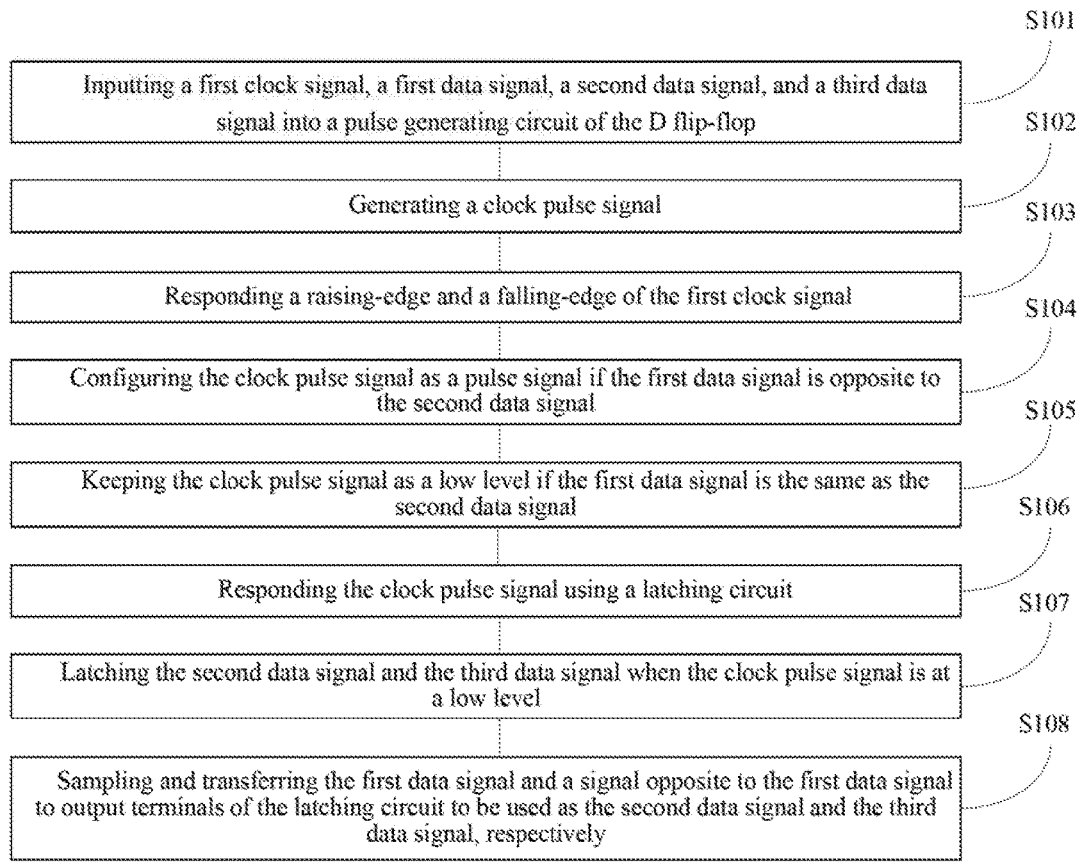
FIG. 8 illustrates an exemplary driving method using a D flip-flop consistent with the disclosed embodiments.

Thus, a signal driving methods may be realized by the disclosed D flip-flops. FIG. 8 illustrates an exemplary signal driving method using a disclosed D flip flop.

As shown in FIG. 8, the signal driving method may include inputting a first clock signal, a first data signal, a second data signal, and a third data signal into a pulse generating circuit of the D flip flop (S101); generating a clock pulse signal (S102); responding a raising-edge and a falling-edge of the first clock signal (S103); configuring the clock pulse signal as a pulse signal if the first data signal is opposite to the second data signal (S104); keeping the clock pulse signal as a low level if the first data signal is the same as the second data signal (S105); responding to the clock pulse signal using a latching circuit (S106); latching the second data signal and the third data signal when the clock pulse signal is at a low level (S107); and sampling and transferring the first data signal and a signal opposite to the first data signal to output terminals of the latching circuit to be used as the second data signal and the third data signal, respectively (S108).

Thus, according to the disclosed circuit structures and methods, the disclosed D-flip-flops may be configured to input a first clock signal and a first data signal, and output a second data signal and a third data signal opposite to the second data signal. The D flip-flop may include a signal generating circuit and a latching circuit. The latching circuit may latch the second data signal and the third data signal, or respond a clock pulse signal, and sample and transfer the first data signal and a data signal opposite to the first data signal. The pulse signal generating circuit may respond the raising-edge and the falling-edge of the first clock signal. If the first data signal and the second data signal are opposite, the clock pulse signal generated by the pulse signal generating circuit may be configured as a pulse signal. If the first data signal and the second data signal are same, the clock pulse signal may be at a low level.

In the disclosed circuit structures, the input signal and the output signal of the D flip-flop may be introduced into the input terminals of the pulse signal generating circuit. Comparing with the existing D flip-flops only responding the raising-edge and the falling-edge of the clock signal and generating pulse signals at both the raising-edge and the falling edge, the disclosed D flip-flops may only generate the clock pulse signal when the first clock signal is opposite to the second data signal of the previous period. If the first clock signal is the same as the second data signal of the previous period, because the output signal of the D flip-flop is not inverted, the generated pulse signal is redundant. Thus, the disclosed D flip-flops may effectively inhibit the redundant sharp change in the internal dynamic node of the pulse signal generating circuit by inhibiting the generation of the redundant narrow pulse signal. Accordingly, the power consumption of the D flip-flops may be reduced.

Further, the latching circuit of the disclosed D flip-flop may respond to the clock pulse signal; and may sample the input signal of the D flip-flop, i.e., the first data signal, and the signal opposite to the first data signal, and transfer such signals to the output terminals of the D flip-flop. The transfer delay of the data be determined by individual transfer transistors. Comparing the inverters of the existing D flip-flops, the disclosed D flip-flops may have shorter transfer delay. Thus, the operation speed of the circuit having the disclosed D flip-flops may be increased.

Further, the disclosed D flip-flops are double-edge flip-flops. The number of the transistors in the disclosed D flip-flops may be reduced. Thus, the power consumption may be reduced; and the setup time may be negative.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A D flip-flop, comprising:
   terminals configured to input a first clock signal and a first data signal and to output a second data signal and a third data signal opposite to the second signal;
   a pulse signal generating circuit configured to receive the first clock signal, the first data signal, the second data signal, and the third data signal and to generate a clock pulse signal, responding to a raising-edge and a falling-edge of the first clock signal, the clock pulse signal being at a high level when the first data signal is opposite to the second data signal, and being at a low level when the first data signal is substantially same as the second data signal; and
   a latching circuit configured to latch the second data signal and the third data signal when the clock pulse signal is at the low level, and to sample and transfer the first data signal and a data signal opposite to the first data signal to be used as the second signal and the third signal respectively when the clock pulse signal is at the high level.

2. The D flip-flop according to claim 1, wherein the pulse signal generating circuit comprises:
   a charging/discharging node connected to a power source;
   a first clock switching circuit, an input terminal of which being connected to the charging/discharging node, responding to a raising edge of the first clock signal, and turning on a connecting path between the input terminal and an output terminal during a first pre-set time window;
a second clock switching circuit, an input terminal of which being connected to the charging/discharging node, an output terminal of which being connected to the output terminal of the first clock switching circuit, responding to the falling-edge of the first clock signal, and turning on a connecting path between the input terminal and the output terminal during a second pre-set time window;
a pulse inverting control circuit, an input terminal of which being connected to the input terminal of the first clock switching circuit and the input terminal of the second clock switching circuit, an output terminal of which is connected to a ground, and a connecting path between the input terminal and the output terminal of which is turned on when the first data signal is opposite to the second data signal of a previous period; and
a first inverter, an input terminal of which is connected to the charging/discharge node, and an output terminal of which outputs the clock pulse signal.

3. The D flip-flop according to claim 2, wherein the pulse inverting control circuit comprises:
a first data switching circuit configured to input the first data signal; and
a second data switching circuit configured to input the second data signal opposite to the first data signal, wherein:
a first terminal of the first data switching circuit is connected to a first terminal of the second data switching circuit, being configured as an input terminal of the pulse inverting control circuit; and
a second terminal of the first data switching circuit is connected to a second terminal of the second data switching circuit, being connected to a ground.

4. The D flip-flop according to claim 3, wherein the first data switching circuit comprises:
a first NMOS transistor; and
a second NMOS transistor
wherein:
a gate of the first NMOS transistor is configured to input the first data signal;
a source of the first NMOS transistor is connected to a drain of the second NMOS transistor;
a drain of the first NMOS transistor is connected to the input terminal of the pulse inverting control circuit;
a gate of the second NMOS transistor is configured to input the third data signal; and
a source of the second NMOS transistor is connected to a ground.

5. The D flip-flop according to claim 3, wherein the second data switching circuit comprises:
a third NMOS transistor; and
a fourth NMOS transistor,
wherein:
a gate of the third NMOS transistor is configured to input the fourth data signal;
a source of the third NMOS transistor is connected to a drain of the fourth NMOS transistor;
a drain of the third NMOS transistor is connected to the input terminal of the pulse inverting control circuit;
a gate of the fourth NMOS transistor is connected to the second data signal; and
a source of the fourth NMOS transistor is connected to a ground.

6. The D flip-flop according to claim 2, wherein:
the charging/discharging node is connected to the power source by a first PMOS transistor;
a source of the first PMOS transistor is connected to the power source;
a gate of the first PMOS transistor in connected to a ground; and
a drain of the first PMOS transistor is connected to the charging/discharging node.

7. The D flip-flop according to claim 2, wherein the first clock switching circuit comprises:
a fifth NMOS transistor; and
a sixth NMOS transistor,
wherein:
a drain of the fifth NMOS transistor is connected to the charging/discharging node;
a gate of the fifth NMOS transistor is configured to the input the first clock signal;
a source of the fifth NMOS transistor is connected to a drain of the sixth NMOS transistor;
a source of the sixth NMOS transistor is connected to the input terminal of the pulse inverting control circuit;
a gate of the sixth NMOS transistor is configured to input the fourth clock signal;
a phase of the fourth clock signal is opposite to a phase of the first clock signal; and
the fourth clock signal has a third delay with the first clock signal.

8. The D flip-flop according to claim 7, wherein the second clock switching circuit comprises:
a seventh NMOS transistor; and
an eighth NMOS transistor,
wherein:
a drain of the seventh NMOS transistor is connected to the charging/discharging node;
a gate of the seventh NMOS transistor is configured to the input the second clock signal;
a source of the seventh NMOS transistor is connected to a drain of the eighth NMOS transistor;
a phase of the second clock signal is opposite to the phase of the first clock signal;
the second clock signal has a first delay with the first clock signal;
the first delay is smaller than the third delay;
a source of the eighth NMOS transistor is connected to the output terminal of the pulse inverting control circuit;
a gate of the eighth NMOS transistor is configured to input a fifth clock signal;
a phase of the fifth clock signal is the same as the phase of the first clock signal the fifth clock signal has a fourth delay with the first clock signal; and
the fourth delay is greater than the third delay.

9. The D flip-flop according to claim 8, wherein:
the first clock signal outputs the second clock signal through a second inverter;
the second clock signal outputs the third clock signal through a third inverter;
the third clock signal outputs the fourth clock signal through a fourth inverter; and
the fourth clock signal outputs the fifth clock signal through a fifth inverter.

10. The D flip-flop according to claim 9, wherein the second inverter comprises:
a second PMOS transistor;
a ninth NMOS transistor; and a tenth NMOS transistor,
wherein:
a gate of the second PMOS transistor is connected to a gate of the ninth NMOS transistor and configured as an input of the second inverter;
a source of the PMOS transistor is connected to a power source;
a drain of the second PMOS transistor is connected to a drain of the ninth NMOS transistor and configured as an output terminal of the second inverter;
a source of the ninth NMOS transistor is connected to a drain of the tenth NMOS transistor;
a gate of the tenth NMOS transistor is connected to the power source; and
a source of the tenth NMOS transistor is connected to a ground.

11. The D flip-flop according to claim 1, wherein the latching circuit comprises:
a sixth inverter configured to invert a phase of the first data signal to output the fourth data signal;
a transmission circuit; and
a latch interconnected with the transmission circuit, wherein:
the transmission circuit samples the first data signal and transfers the first data signal to a first output terminal of the latch to use as a second data signal, and samples the fourth data signal and transfer the fourth data signal to a second output terminal of the latch to use as the second data signal when the clock signal is at the high level; and
the latch latches the second data signal and the third signal when the clock pulse signal is at the low level.

12. The D flip-flop according to claim 11, wherein:
a power source terminal of the latch is connected to the power source through a pulse switching circuit;
the pulse switching circuit is turned on when the clock pulse signal is at the low level; and
the pulse switching circuit is turned off when the clock pulse signal is at the high level.

13. The D flip-flop according to claim 11, wherein the transmission circuit comprises:
an eleventh NMOS transistor; and
a twelfth NMOS transistor,
wherein:
a gate of the eleventh NMOS transistor is configured to input the clock pulse signal;
a drain of the eleventh NMOS transistor is connected to an input terminal of the sixth inverter;
a source of the eleventh NMOS transistor is configured to output a second data signal;
a gate of the twelfth NNOS transistor is configured to input the clock pulse signal;
the drain of the twelfth NMOS transistor is connected to an output terminal of the sixth inverter; and
the source of the twelfth NMOS transistor is configured to output the third data signal.

14. The D flip-flop according to claim 12, wherein the latch comprises:
a third PMOS transistor;
a fourth PMOS transistor;
a thirteen NMOS transistor; and
a fourteenth NMOS transistor,
wherein:
a gate of third PMOS transistor is connected to a gate of the thirteenth NMOS transistor and configured to receive the second data signal;
a source of the third PMOS transistor is connected to a source of the fourth PMOS transistor and configured as the power source terminal of the latch; and
a drain of the third PMOS transistor is connected to the gate of the fourth PMOS transistor;
a gate of the fourth PMOS transistor is connected to a gate of the fourteenth NMOS transistor and configured to receive the third data signal;
a drain of the fourth PMOS transistor is connected to a drain of the fourteenth NMOS transistor and a gate of the third PMOS transistor;
a source of the thirteen NMOS transistor is connected to a ground; and
a source of the fourteenth NMOS transistor is connected to a ground.

15. The D flip-flop according to claim 12, wherein the pulse switching circuit comprises:
a fifth PMOS transistor,
wherein:
a gate of the fifth PMOS transistor is configured to input the pulse signal;
a source of the fifth PMOS transistor is connected to a power source; and
a drain of the fifth PMOS transistor is connected to the power source terminal of the latch.

16. A signal driving method using a D flip-flop, comprising:
inputting a first clock signal, a first data signal, a second data signal and a third data signal into a pulse generating circuit of the D flip-flop;
generating a clock pulse signal;
responding to a raising-edge and a falling-edge of the first clock signal;
configuring the clock pulse signal as a high level if the first data signal is opposite to the second data signal;
keeping the clock pulse signal as a low level if the first data signal is the same as the second data signal;
responding to the clock pulse signal using a latching circuit;
latching the second data signal and the third data signal when the clock pulse signal is at the low level; and
sampling and transferring the first data signal and a data signal opposite to the first data signal to output terminals of the latching circuit to be used as the second data signal and the third data signal, respectively.

17. The method according to claim 16, wherein:
the first clock signal outputs a second clock signal through a second inverter;
the second clock signal outputs a third clock signal through a third inverter;
the third clock signal outputs a fourth clock signal through a fourth inverter; and
the fourth clock signal outputs a fifth clock signal through a fifth inverter.

18. The method according to claim 17, wherein;
a phase of the first clock signal is opposite to a phase of the second clock signal; and
a phase of the fifth clock signal is the same as the phase of the first clock signal.

19. The method according to claim 16, wherein;
a setup time of the D flip-flop is negative.

20. The method according to claim 16, wherein:
transfer delays of the latching circuit is determined by individual transfer transistors.

* * * * *